(12) United States Patent
Pfeiffer et al.

(10) Patent No.: US 11,355,719 B2
(45) Date of Patent: Jun. 7, 2022

(54) TRANSPARENT ELECTRODE FOR OPTOELECTRONIC COMPONENTS

(71) Applicant: HELIATEK GMBH, Dresden (DE)

(72) Inventors: Martin Pfeiffer, Dresden (DE); Christian Uhrich, Dresden (DE); Ulrike Bewersdorff-Sarlette, Radebeul (DE); Jan Meiss, Munich (DE); Karl Leo, Dresden (DE); Moritz Riede, Oxford (GB); Sylvio Schubert, Dresden (DE); Lars Mueller-Meskamp, Dresden (DE)

(73) Assignee: HELIATEK GMBH, Dresden (DE)

( * ) Notice: Subject to any disclaimer, the term of this patent is extended or adjusted under 35 U.S.C. 154(b) by 0 days.

(21) Appl. No.: 14/411,983

(22) PCT Filed: Jul. 2, 2013

(86) PCT No.: PCT/IB2013/055425
§ 371 (c)(1),
(2) Date: Dec. 30, 2014

(87) PCT Pub. No.: WO2014/006565
PCT Pub. Date: Jan. 9, 2014

(65) Prior Publication Data
US 2015/0295195 A1 Oct. 15, 2015

(30) Foreign Application Priority Data

Jul. 2, 2012 (DE) .......... 10 2012 105 809
Jul. 2, 2012 (DE) .......... 10 2012 105 810

(51) Int. Cl.
*H01L 51/44* (2006.01)
*H01L 51/00* (2006.01)
(Continued)

(52) U.S. Cl.
CPC ........ *H01L 51/442* (2013.01); *H01L 51/0021* (2013.01); *H01L 51/4293* (2013.01);
(Continued)

(58) Field of Classification Search
CPC ............. H01L 51/442; H01L 51/0021; H01L 51/4293; H01L 51/4273; H01L 51/441
(Continued)

(56) References Cited

U.S. PATENT DOCUMENTS 5,093,698 A   3/1992  Egusa
5,457,565 A * 10/1995 Namiki ............... H01L 51/5092
                                                         257/103
(Continued)

FOREIGN PATENT DOCUMENTS

DE   102004014046 A1   9/2004
DE   10338406 A1   3/2005
(Continued)

OTHER PUBLICATIONS

Man et al, Tailoring Mg:Ag functionalities for organic light-emitting diodes, 2018, Organic Electronics, 63, 41-46. (Year: 2018).*
(Continued)

*Primary Examiner* — Andrew J Golden
(74) *Attorney, Agent, or Firm* — Heslin Rothenberg Farley and Mesiti PC; Nicholas Mesiti (57) ABSTRACT

An optoelectronic component on a substrate includes a first and a second electrode. The first electrode is arranged on the substrate and the second electrode forms a counter electrode. At least one photoactive layer system is arranged between these electrodes. The at least one photoactive layer system including at least one donor-acceptor system having organic materials.

12 Claims, 2 Drawing Sheets

(51) Int. Cl.
*H01L 51/42* (2006.01)
*H01L 51/52* (2006.01)

(52) U.S. Cl.
CPC .......... *H01L 51/5231* (2013.01); *Y02B 10/10* (2013.01); *Y02E 10/549* (2013.01); *Y02P 70/50* (2015.11)

(58) Field of Classification Search
USPC ................................................ 136/255, 256
See application file for complete search history.

(56) References Cited

U.S. PATENT DOCUMENTS

| | | | |
|---|---|---|---|
| 6,198,092 B1 * | 3/2001 | Bulovic | ............ B82Y 10/00 136/263 |
| 6,294,822 B1 | 9/2001 | Nakata | |
| 6,559,375 B1 | 5/2003 | Meissner et al. | |
| 6,576,093 B1 | 6/2003 | Burroughes et al. | |
| 7,259,405 B2 * | 8/2007 | Liu | ............ H01L 51/441 257/103 |
| 7,825,326 B2 | 11/2010 | Koppe | |
| 2004/0211458 A1 | 11/2004 | Gui et al. | |
| 2005/0110005 A1 | 5/2005 | Forrest et al. | |
| 2009/0151787 A1 * | 6/2009 | Yoshikawa | ......... H01L 51/4253 136/261 |
| 2009/0223559 A1 | 9/2009 | Kubo et al. | |
| 2011/0023957 A1 * | 2/2011 | Eberspacher | ... H01L 31/022425 136/256 |
| 2011/0139252 A1 | 6/2011 | Chen et al. | |
| 2011/0139253 A1 * | 6/2011 | Wachi | ............... H01L 51/442 136/263 |
| 2011/0309739 A1 | 12/2011 | Song et al. | |
| 2012/0090679 A1 * | 4/2012 | Chittibabu | ......... H01L 51/4273 136/256 |

FOREIGN PATENT DOCUMENTS

| | | |
|---|---|---|
| DE | 10347856 A1 | 6/2005 |
| DE | 10357044 A1 | 7/2005 |
| DE | 102004010954 A1 | 10/2005 |
| DE | 102004035965 A1 | 6/2006 |
| DE | 102006053320 A1 | 5/2008 |
| DE | 102006054524 A1 | 5/2008 |
| DE | 102008051737 A1 | 5/2009 |
| DE | 102008011444 A1 | 9/2009 |
| EP | 0000829 A1 | 8/1978 |
| EP | 1909341 A1 | 4/2008 |
| EP | 2385556 A1 | 11/2011 |
| JP | 05-041153 U | 5/1993 |
| JP | 2004119129 A | 4/2004 |
| JP | 2011009245 A | 1/2011 |
| JP | 2011168747 A | 9/2011 |
| WO | 2004083958 A2 | 9/2004 |
| WO | 2005029607 A1 | 3/2005 |
| WO | 2006054137 A1 | 5/2006 |
| WO | 2006092134 A1 | 9/2006 |
| WO | 2008001577 A1 | 1/2008 |
| WO | 2009056732 A2 | 5/2009 |
| WO | 2009136863 A1 | 11/2009 |
| WO | 2010049512 A1 | 5/2010 |
| WO | 2011160031 A2 | 12/2011 |
| WO | 2011161108 A1 | 12/2011 |

OTHER PUBLICATIONS

Stephens et al., Index of Refraction of Magnesium Oxide, Journal of Research of the National Bureau of Standards, vol. 49, No. 4, 249-252. (Year: 1952).*
Bailey-Salzman, Rhonda F., et al., "Semtransparent organic photovoltaic cells", Applied Physics Letters 88, 233502, 2006, pp. 233502-1-233502-3.
Hiramoto, Masahiro, et al., "Effect of Thin Gold Interstitial-layer on the Photovoltaic Properties of Tandem Organic Solar Cell", Chemistry Letters, The Chemical Society of Japan, 1990, pp. 327-330.
Hiramoto, Masahiro et al., "Three-layered organic solar cell with a photovoltaic interlayer of codeposited pigments", Applied Physics Letters 58(10), Mar. 11, 1991, pp. 1062-1064.
Hofmann, Simone et al., "Top-emitting organic light-emitting diodes: Influence of cavity design", Applied Physics Letters 97, 2010, pp. 253308-253308-3.
Konarka Power Plastic 20 Series, Product Specifications, 8 pages. (2011).
Hiramoto, Masahiro, et al., "Organic Solar Cells Incorporating a p-i-n Junction", Mol. Cryst. Liq. Cryst., vol. 444, 2006, pp. 33-40.
"Controlled Doping of Organic Vacuum Deposited Dye Layers: Basics and Applications", pp. 1-155. (1999).
Meiss, Jan, et al., "Efficient semitransparent small-molecule organic solar cells", Applied Physics Letters 95, 2009, pp. 213306-1-213306-3.
Meiss, Jan et al., "Near-infrared absorbing semitransparent organic solar cells", Applied Physics Letters 99, 2011, pp. 193307-1-193307-3.
International Search Report for PCT/IS2013/055425 dated Apr. 24, 2014.
Filmetrics, Refractive Index of ITO, Indium Tin Oxide, InSnO, 2016, 1 page.

* cited by examiner

TRANSPARENT ELECTRODE FOR OPTOELECTRONIC COMPONENTS

CROSS REFERENCE TO RELATED APPLICATIONS

This application is a national stage filing under section 371 of International Application No. PCT/IB2013/055425, filed on Jul. 2, 2013, and published in German on Jan. 9, 2014 as WO 2014/006565 A2, which claims priority to German Application No. 102012105809.1, filed on Jul. 2, 2012, and German Application No. 102012105810.5, filed on Jul. 2, 2012, the entire content of said applications being hereby incorporated herein by reference.

BACKGROUND ART

The invention relates to a transparent electrode for optoelectronic components.

Optoelectronic components, for example, solar cells or LEDs, TFTs, etc., currently have broad applications in the everyday environment and the industrial environment. In this case, those components which enable an arrangement on curved or bulging surfaces because of their embodiment are of particular interest.

Thus, for example, thin-film solar cells are known, which have a flexible design and therefore enable an arrangement on curved surfaces. Such solar cells preferably have in this case active layers made of amorphous silicon ($\alpha$-Si) or CIGS (Cu(In, Ga) (S, Se)$_2$).

These thin-film solar cells have the disadvantage above all of the high production costs due to the materials.

Organic light-emitting diodes (OLEDs) are also known, which can be embodied as very thin and therefore also flexible because backlighting is not required.

Furthermore, solar cells having organic active layers, which are embodied as flexible (Konarka—Power Plastic Series) are also known. The organic active layers can be constructed in this case from polymers (for example, U.S. Pat. No. 7,825,326 B2) or small molecules (for example, EP 2385556 A1). While polymers are distinguished in that they cannot be vaporized and therefore only can be applied from solutions, small molecules can be vaporized.

The advantage of such components based on organic materials in relation to the conventional components based on inorganic materials (semiconductors such as silicon, gallium arsenide) are the partially extremely high coefficients of optical absorption (up to $2 \times 10^5$ cm$^{-1}$), so that the possibility suggests itself of producing very thin solar cells with low material and energy expenditure. Further technological aspects are the low costs, the possibility of producing flexible large-area parts on plastic films, and the nearly unlimited variation possibilities and the unlimited availability of organic chemistry.

A solar cell converts light energy into electrical energy. The term photoactive also refers in this case to the conversion of light energy into electrical energy. In contrast to inorganic solar cells, in the case of organic solar cells, free charge carriers are not directly generated by the light, but rather firstly excitons form, i.e., electrically neutral excitation states (bound electron-hole pairs). These excitons are first separated in a second step into free charge carriers, which then contribute to the electrical current flow.

A possible implementation, which was already proposed in the literature, of an organic solar cell consists of a pin diode [Martin Pfeiffer, "Controlled doping of organic vacuum deposited dye layers: basics and applications", PhD thesis TU Dresden, 1999], having the following layer structure:

| | |
|---|---|
| 0 | carrier, substrate, |
| 1 | base contact, usually transparent, |
| 2 | p-layer(s), |
| 3 | i-layer(s), |
| 4 | n-layer(s), |
| 5 | cover contact. |

In this case, n or p means an n-doping or p-doping, which results in an increase of the density of free electrons or holes in the thermal equilibrium state. However, it is also possible that the n-layer(s) or p-layer(s) are at least partially nominally undoped and only have preferable n-conductive or preferable p-conductive properties because of the material properties (for example, different mobilities), because of unknown contaminants (for example, remaining residues from synthesis, decomposition or reaction products during the layer production), or because of influences of the environment (for example, adjoining layers, diffusion of metals or other organic materials, gas doping from the surrounding atmosphere). In this meaning, such layers are primarily to be understood as transport layers. The term i-layer refers in contrast to a nominally undoped layer (intrinsic layer). One or more i-layers can consist in this case of layers both made of one material, and also a mixture of two materials (so-called inter-penetrating networks or bulk heterojunction; M. Hiramoto et al., Mol. Cryst. Liq. Cryst., 2006, 444, pp. 33-40). The light incident through the transparent base contacts generates excitons (bound electron-hole pairs) in the i-layer or in the nip-layer. These excitons can only be separated by very high electric fields or at suitable interfaces. Sufficiently high fields are not available in organic solar cells, so that all promising concepts for organic solar cells are based on the exciton separation at photoactive interfaces. The excitons reach such an active interface by diffusion, where electrons and holes are separated from one another. The material which receives the electrons is referred to in this case as the acceptor, and the material which receives the hole is referred to as the donator (or donor). The separating interface can lie between the p (n)-layer and the i-layer or between two i-layers. The electrons are now transported away to the n-region and the holes to the p-region in the installed electrical field of the solar cell. The transport layers are preferably transparent or substantially transparent materials having large bandgap (wide gap), as are described, for example, in WO 2004083958. In this case, materials, the absorption maximum of which is in the wavelength range<450 nm, preferably <400 nm, are referred to as wide gap materials in this case.

Since excitons are always first generated by the light and free charge carriers are not yet generated, the low-recombination diffusion of excitons at the active interface plays a critical role in organic solar cells. To provide a contribution to the photocurrent, in a good organic solar cell, the exciton diffusion length must therefore significantly exceed the typical penetration depth of the light, so that the predominant part of the light can be used. Organic crystals or thin films which are perfect structurally and with regard to the chemical purity certainly fulfill this criterion. However, for large-area applications, the use of monocrystalline organic materials is not possible and the production of multiple layers with sufficient structural perfection is still very difficult up to this point. If the i-layer is a mixed layer, only one of the components or also both components thus assume the task of the light absorption. The advantage of mixed layers is that the generated excitons must now only cover a very short distance until they reach the domain boundary, where they are separated. The electrons or holes are transported away separately in the respective materials. Since the materials are in contact with one another everywhere in the mixed layer, it is decisive in the case of this concept that the separate charges have a long lifetime on the respective material and closed percolation paths for both charge carrier types toward the respective contact are present from every location.

The doping of organic materials is known from U.S. Pat. No. 5,093,698. By admixing an acceptor-type or donator-type dopant substance, the equilibrium charge carrier concentration in the layer is elevated and the conductivity is increased. According to U.S. Pat. No. 5,093,698, the dopant layers are used as injection layers at the interface to the contact materials in electroluminescent components. Similar doping approaches are also analogously reasonable for solar cells.

Various possible implementations for the photoactive i-layer are known from the literature. It can thus relate in this case to a double layer (EP 0000829) or a mixed layer (Hiramoto, Appl. Phys. Lett. 58, 1062 (1991)). A combination of double layers and mixed layers is also known (Hiramoto, Appl. Phys. Lett. 58, 1062 (1991); U.S. Pat. No. 6,559,375). It is also known that the mixture ratio is different in various regions of the mixed layer (US 20050110005) or the mixture ratio has a gradient.

Furthermore, tandem solar cells or multiple solar cells are known from the literature (Hiramoto, Chem. Lett. 1990, 327 (1990); DE 102004014046).

Organic tandem solar cells have been known from the literature for some time (Hiramoto, Chem. Lett., 1990, 327 (1990)). A 2 nm thick gold layer is located between the two single cells in the tandem cell of Hiramoto et al. The task of this gold layer is to ensure a good electrical connection between the two single cells: the gold layer causes an efficient recombination of the holes from one partial cell with the electrons from the other partial cell and therefore causes the two partial cells to be electrically connected in series. Furthermore, the gold layer absorbs a part of the incident light, like any thin metal layer (or metal cluster). This absorption is a loss mechanism in the tandem cell of Hiramoto, since thus less light is available to the photoactive layers (H2Pc (metal-free phthalocyanine)/Me-PTC (N,N"-dimethylperylene-3,4,9,10-bis(dicarboximide)) in the two single cells of the tandem cell. The task of the gold layer is therefore solely on the electrical side in this tandem structure. Within this conception, the gold layer should be as thin as possible or, in the best case, should be omitted completely.

Furthermore, organic pin tandem cells are known from the literature (DE 102004014046): the structure of such a tandem cell consists of two pin single cells, wherein the layer sequence "pin" describes the sequence of a p-doped layer system, an undoped photoactive layer system, and an n-doped layer system. The doped layer systems preferably consist of transparent materials, so-called wide gap materials/layers, and they can also be partially or entirely undoped in this case or can also have different dopant concentrations depending on the location or can have a continuous gradient in the dopant concentration. Especially also very low-doped or high-doped regions in the boundary region at the electrodes, in the boundary region to another doped or undoped transport layer, in the boundary region to the active layers, or in the case of tandem or multiple cells, in the boundary region to the adjoining pin or nip partial cell, i.e., in the region of the recombination zone, are possible. An arbitrary combination of all of these features is also possible. Of course, such a tandem cell can also be a so-called inverted structure (for example, nip tandem cell). All of these possible tandem cell implementation forms are referred to hereafter with the term pin tandem cells. One advantage of such a pin tandem cell is that due to the use of doped transport layers, a very simple and simultaneously very efficient possible implementation for the recombination zone between the two partial cells is possible. The tandem cell has, for example, a pinpin structure (or nipnip is also possible, for example). An n-doped layer and a p-doped layer, which form a pn-system (or np-system), are located in each case at the interface between the two pin partial cells. Very efficient recombination of the electrons and holes takes place in such a doped pn-system. The stacking of two pin single cells therefore directly results in a complete pin tandem cell, without still further layers being required. It is especially advantageous here that thin metal layers are no longer necessary, as in Hiramoto, in order to ensure the efficient recombination. The loss absorption of such thin metal layers can thus be completely avoided.

The top contacts previously described in the literature are not adequate for implementing optoelectronic components having high transparency and have excessively high reflections. Furthermore, there is a high level of interest in the implementation of transparent top contacts on opaque substrates.

Thin thermally vapor deposited metal layers having intermediate layers and sputtered ITO layers are known from the literature for implementing transparent top contacts on organic components.

Bailey-Salzmann et al. disclose in their publication of 2006 (APPLIED PHYSICS LETTERS 88, 233502 _2006) the use of thin Ag layers (25 nm) for implementing semi-transparent organic solar cells.

Meiss et al. disclose in 2009 in their publication (APPLIED PHYSICS LETTERS 95, 213306 _2009) the use of a doped transport layers and thin Ag layers (14 nm) for implementing transparent organic solar cells. In addition, a thin Al intermediate layer is used under the Ag layer for smoothing thereof in this publication. The use of organic layers on the thin Ag layer to elevate the transparency of the top contact is also disclosed here.

In their publication of 2011, Meiss et al. disclose (APPLIED PHYSICS LETTERS 99, 193307, 2011) the use of a thin Ca layer as an alternative to the above-described thin Al intermediate layer.

The implementation of organic components having transparent top contact on opaque base contact is also known from the literature. Hoffmann et al. disclose, for example, in their publication of 2012 (APPLIED PHYSICS LETTERS 97, 253308, 2010) an organic light-emitting diode (OLED) using doped transport layers, a thin Ag metal layer (13 nm), and an organic layer on the Ag layer to elevate the transparency of the top contact.

In the case of opaque substrates, the known solutions result in increased parasitic absorption and reflection losses and therefore a reduction of the efficiency in relation to transparent substrates, for example, using ITO base contacts.

The object of the present invention is therefore to overcome the above-mentioned disadvantages of the prior art and to specify a transparent top contact for optoelectronic components.

BRIEF SUMMARY OF THE INVENTION

According to the invention, an optoelectronic component on a substrate comprises a first and a second electrode, wherein the first electrode is arranged on the substrate and the second electrode forms a counter electrode, wherein at least one photoactive layer system is arranged between these electrodes, which comprises at least one donor-acceptor system having organic materials, wherein the counter electrode has at least one first layer comprising metal or a metal alloy. Furthermore, the counter electrode comprises a first intermediate layer made of an alkali or alkaline earth metal, or a metal oxide, wherein the first intermediate layer is arranged between the first layer and the photoactive layer system of the component. In addition, the counter electrode comprises a second layer, which is arranged on the first layer and has a layer thickness between 10 and 100 nm.

In one embodiment, the metal of the first layer is selected from a group consisting of Ag, Au, Pt, Cr, Ti, Al, Zr, Cu, Zn, Sn, Sr, La, In, Sc, Hf.

In a further embodiment of the invention, the first layer comprises an alkali or alkaline earth metal, or a metal oxide.

In one embodiment of the invention, the first layer contains Ag.

In one embodiment of the invention, the first layer contains an alloy made of Ag and Ca or Ag and Mg.

In one embodiment of the invention, the layer contains an alloy made of Ag and Ca or Ag and Mg, wherein the proportion of the Ag or Ca or Mg is at least 30%.

In a further embodiment, the first intermediate layer has a layer thickness of 0.05 to 30 nm.

In a further embodiment, the first intermediate layer contains Ca or $MoO_x$.

In a further embodiment, the first intermediate layer contains an alkali or alkaline earth metal halogenide.

In a further embodiment of the invention, the second layer contains an alkali or alkaline earth metal, a metal oxide, or an organic material.

In a further embodiment of the invention, a protective layer is arranged on the second layer, which comprises a metal oxide and has a layer thickness>100 nm. The protective layer is used in this case as a scratch protection, for example.

In a further embodiment of the invention, the substrate is embodied as opaque or transparent.

Opaque is understood in the meaning of the invention as nontransparent.

In a further embodiment of the invention, the substrate is embodied as flexible.

A flexible substrate is understood in the meaning of the present invention as a substrate which ensures deformability as a result of external force action. Such flexible substrates are thus suitable for arrangement on curved surfaces. Flexible substrates are foils or metal strips, for example.

In a further embodiment of the invention, the substrate is embodied as flexible.

In a further embodiment of the invention, the electrode which is arranged on the substrate is embodied as opaque or transparent.

In a further embodiment of the invention, the electrode which is arranged on the substrate comprises a metal, metal oxide, metal grid, metal-metal oxide layer system, metal particles, metal nanowire, graphene, or organic semiconductors.

In a first embodiment of the invention, the first intermediate layer of the counter electrode has a layer thickness between 0.1 and 100 nm and is deposited by thermal vapor deposition. This is advantageous in particular if metallic layers or metal oxide layers are to be deposited on organic layers or layers containing organic materials.

Thermal vapor deposition is understood in the meaning of the present invention as the heating of the material to be vaporized in a vapor deposition unit, wherein the material is heated and vaporized as a result thereof, so that a material vapor arises, wherein this material vapor is deposited as a layer on a substrate, which is arranged in spatial proximity to the vapor deposition unit.

In one embodiment of the invention, the first layer has a layer thickness between 0.5 and 30 nm.

In one embodiment of the invention, the first layer is deposited by thermal vapor deposition and has a layer thickness between 0.5 and 20 nm.

In a further embodiment, the first intermediate layer contains a molybdenum oxide selected from the group MoO, $MoO_2$, and $MoO_3$.

In a further embodiment of the invention, the first layer of the counter electrode has a layer thickness between 3 and 20 nm, preferably 5 to 10 nm, and is not deposited by thermal vapor deposition. Alternative deposition methods in comparison to thermal vapor deposition, which are referred to hereafter as deposition technologies, can be, for example, electron beam evaporation, pulsed laser deposition or pulsed laser ablation, arc evaporation or arc PVD, molecular beam epitaxy, sputter deposition or cathode sputtering, ion beam assisted deposition (IBAD), ion plating, or ionized cluster beam deposition (ICBD).

The deposition of the first layer by alternative deposition methods unifies multiple advantages in comparison to thermal vapor deposition:

1) In relation to thermal vapor deposition, smoother layers can be created with the aid of alternative deposition methods, so that with very thin layers, a closed layer having high conductivity in the plane of the substrate can already be achieved. Because of the low layer thickness, high levels of transmission of the layer can be achieved, with sufficient conductivity (in the plane) at the same time.

2) In relation to thermal vapor deposition, a high degree of homogeneity of the layer thickness on the substrate can be created with the aid of the above-mentioned deposition technologies. This is particularly important in the case of thin top contact layers, since variations in the layer thickness of the second layer directly affect the performance of the component and result in a visible change of the visual impression of the component, which is generally undesirable.

3) Due to the use of alternative deposition methods in relation to thermal vapor deposition, it is possible to use a greater number of different materials with greater variation of the process parameters (for example, reactive sputtering).

In a further embodiment of the invention, the second layer has a layer thickness between 10 and 100 nm and is deposited by thermal vapor deposition or alternative deposition methods. The second layer is primarily used for the thin-film antireflection coating of the top contact and should have a higher index of refraction than the adjoining medium, which follows the second layer, in the wavelength range usable for the solar cell.

In a further embodiment of the invention, the second layer has an index of refraction>2, preferably 2.2. This is advantageous in particular to ensure a higher index of refraction in the following adhesive layers in relation to the wavelength range usable for the solar cell. Exemplary compounds having an index of refraction>2 are, for example, selenides, sulfides, tellurides, nitrides, and polymers, for example, ZnS, ZnSe, or ZnTe.

In a further embodiment of the invention, a protective layer which contains a metal oxide, and which has a layer thickness>100 nm, is arranged on the second layer. This protective layer offers a mechanical protection to the component, so that touching the active side is enabled, and/or implements a reinforced protection of the organic component from water and oxygen in particular.

In a further embodiment of the invention, at least one second intermediate layer made of a metal or metal oxide, which has a layer thickness between 0.02 and 40 nm, is incorporated between the first intermediate layer and the first layer of the counter electrode This second intermediate layer can function as a smoothing layer or as a wetting layer or seed layer.

In one embodiment of the second intermediate layer as a smoothing layer, the roughness of underlying layers is balanced out, so that the conductive first layer grows on the first intermediate layer, which is smoothed by the second intermediate layer, wherein a sufficient conductivity is already achieved at low layer thicknesses of the first layer.

In one design of the second intermediate layer as a wetting layer, it prevents or reduces the island growth of the first layer, so that sufficient conductivity in the plane of the substrate is already created at low layer thicknesses of the first layer. In one design of the second intermediate layer as a seed layer, the island growth cannot be suppressed, but islands, which lie very close to one another, form on the seeds of the seed layer during the deposition of the first layer, so that sufficient conductivity in the plane of the substrate is already created at low layer thicknesses of the first layer.

The second intermediate layer can be deposited by means of the above-mentioned deposition technologies, for example.

In one design of the embodiment, the second intermediate layer is embodied from multiple layers having differing material composition. The second intermediate layer can additionally be embodied from a conductive material or a mixture of materials. It is additionally conceivable that this layer contributes to the stress reduction between the layers of the component. Such stress between the layers can occur, for example, because of different coefficients of thermal expansion (coefficients of strain, inter alia), which can result in partial or complete detachment of the layers in the worst case.

In a further embodiment of the invention, a third intermediate layer having a layer thickness between 0.02 nm and 40 nm, made of a metal or metal oxide, is incorporated between the first and the second layers of the counter electrode. This third intermediate layer can function as a smoothing layer, wetting layer, or seed layer. The third intermediate layer can be deposited by means of one of the above-mentioned deposition technologies or can be thermally deposited. In one design of the embodiment, the third intermediate layer is embodied from multiple layers having differing material composition. The third intermediate layer can additionally be embodied from a conductive material or a mixture of materials. It is additionally conceivable that this third intermediate layer contributes to the stress reduction.

In a further embodiment of the invention, the second layer comprises an alkali or alkaline earth metal, a metal oxide, or an organic material.

In a further embodiment of the invention, the second layer comprises a nitride, selenide, sulfide, oxide, telluride, or polymer.

In a further embodiment of the invention, the second layer comprises Ag, Au, Pt, Cr, Ti, Al, Zr, Cu, Zn, Sn, Sr, La, In, Sc, Hf or an alloy comprising at least one of the above-mentioned elements.

In a further embodiment of the invention, the component is a pin single cell, pin tandem cell, pin multiple cell, nip single cell, nip tandem cell, or nip multiple cell.

In a further embodiment of the invention, the component is embodied from a combination of nip, ni, ip, pnip, pni, pip, nipn, nin, ipn, pnipn, pnin, or pipn structures, in which multiple independent combinations, which contain at least one i-layer, are stacked one on top of another.

In a further embodiment of the invention, the active layer comprises at least one mixed layer having at least two main materials, wherein these form a photoactive donor-acceptor system.

In a further embodiment of the invention, at least one main material is an organic material.

In a further embodiment of the invention, the organic material relates to small molecules. The term small molecules are understood in the meaning of the invention as monomers which can be vaporized and therefore deposited on the substrate.

In a further embodiment of the invention, the organic material at least partially relates to polymers.

In a further embodiment of the invention, at least one of the active mixed layers comprises a material from the group of fullerenes or fullerene derivatives as an acceptor.

In a further embodiment of the invention, at least one doped, partially doped, or undoped transport layer is arranged between the electrode and the counter electrode.

In a further embodiment of the invention, a doped, partially doped, or undoped transport layer is arranged between the counter electrode and the photoactive layer system.

In a further embodiment of the invention, the optoelectronic component is an organic solar cell.

In a further embodiment of the invention, the optoelectronic component is an organic light-emitting diode.

The subject matter of the invention is also an electrode device made of a layer system comprising at least one first layer made of a metal or metal alloy and a first intermediate layer, which is arranged between a photoactive layer and the first layer, wherein the layer system has a transparency of 40 to 95%.

Furthermore, the use of an electrode device in an optoelectronic component is also the subject matter of the invention.

Furthermore, a method for producing an electrode device for an optoelectronic component comprising the following steps is also the subject matter of the invention:

depositing a first intermediate layer made of an alkali or alkaline earth metal or metal oxide on a photoactive layer system of the component, wherein the deposition is performed by thermal vapor deposition,     depositing a first layer on the first intermediate layer, wherein the deposition of the first layer is performed by a deposition technology selected from the group consisting of electron beam evaporation, pulsed laser deposition, arc PVD, molecular beam epitaxy, cathode sputtering, ion beam assisted deposition, ion plating, or ionized cluster beam deposition, and     depositing a second layer on the first layer.

In a further embodiment of the invention, the optoelectronic component has more than one photoactive layer between the electrode and the counter electrode.

In a further embodiment of the invention, the mixed layers preferably each consist of two main materials.

In a further embodiment of the invention, a gradient of the mixture ratio can be provided in the individual mixed layers.

In a further embodiment of the invention, one or more of the further organic layers are doped wide gap layers, wherein the maximum of the absorption is at <450 nm.

In a further embodiment of the invention, at least two main materials of the mixed layers have different optical absorption spectra.

In a further embodiment of the invention, the main materials of the mixed layers have different optical absorption spectra, which mutually supplement one another, to cover the broadest possible spectral range.

In a further embodiment of the invention, the absorption range of at least one of the main materials of the mixed layers extends into the infrared range.

In a further embodiment of the invention, the absorption range of at least one of the main materials of the mixed layers extends into the infrared range in the wavelength range from >700 nm to 1500 nm.

In a further embodiment of the invention, the HOMO and LOMO levels of the main materials are adapted so that the system enables a maximum open circuit voltage, a maximum short-circuit current, and a maximum filling factor.

In a further embodiment of the invention, at least one of the photoactive mixed layers contains, as an acceptor, a material from the group of the fullerenes or fullerene derivatives ($C_{60}$, $C_{70}$, etc.).

In a further embodiment of the invention, all photoactive mixed layers contain, as an acceptor, a material from the group of the fullerenes or fullerene derivatives ($C_{60}$, $C_{70}$, etc.).

In a further embodiment of the invention, at least one of the photoactive mixed layers contains, as a donor, a material from the class of phthalocyanines, perylene derivatives, oligothiophenes, or a material as described in WO 2006092134.

In a further embodiment of the invention, at least one of the photoactive mixed layers contains, as an acceptor, the material fullerene $C_{60}$ and, as a donor, the material 4P-TPD.

Polymer solar cells, which contain two or more photoactive mixed layers, are also comprised in the meaning of the invention, wherein the mixed layers directly adjoin one another. However, the problem exists in polymer solar cells that the materials are applied from solution and therefore a further applied layer very easily has the result that the layers lying underneath will be detached, dissolved, or changed in their morphology. In polymer solar cells, only very restricted multiple mixed layers can therefore be produced, and also only in that various material and solvent systems are used, which mutually influence one another hardly or not at all during the production. Solar cells made of small molecules have a very clear advantage here, since by way of the vapor deposition process in vacuum, arbitrary systems and layers can be applied to one another and therefore the advantage of the multiple mixed layer structure can be used very broadly and can be implemented using arbitrary material combinations.

In a further embodiment of the invention, a p-doped layer is also provided between the first electron-conducting layer (n-layer) and the electrode located on the substrate, so that it is a pnip or pni structure, wherein preferably the doping is selected to be sufficiently high that the direct pn contact does not have a blocking effect, but rather low-loss recombination occurs, preferably by way of a tunneling process.

In a further embodiment of the invention, a p-doped layer is also provided in the component between the active layer and the electrode located on the substrate, so that it is a pip or pi structure, wherein the additional p-doped layer has a Fermi level which is at most 0.4 eV, but preferably less than 0.3 eV below the electron transport level of the i-layer, so that lower-loss electron extraction from the i-layer into this p-layer can occur.

In a further embodiment of the invention, an n-layer system is also provided between the p-doped layer and the counter electrode, so that it is an nipn or ipn structure, wherein preferably the doping is selected to be sufficiently high that the direct pn contact does not have a blocking effect, but rather low-loss recombination occurs, preferably by way of a tunneling process.

In a further embodiment, an n-layer system can also be provided in the component between the intrinsic, photoactive layer and the counter electrode, so that it is an nin or in structure, wherein the additional n-doped layer has a Fermi level which is at most 0.4 eV, but preferably less than 0.3 eV above the hole transport level of the i-layer, so that lower-loss hole extraction from the i-layer into this n-layer can occur.

In a further embodiment, the acceptor material has an absorption maximum in the wavelength range>450 nm.

In a further embodiment, the donor material has an absorption maximum in the wavelength range>450 nm.

In a further embodiment, the active layer system also contains, in addition to the mentioned mixed layer, further photoactive single layers or mixed layers.

In a further embodiment, the n-material system contains one or more doped wide gap layers. The term wide gap layers defines in this case layers having an absorption maximum in the wavelength range<450 nm.

In a further embodiment, the p-material system contains one or more doped wide gap layers.

In a further embodiment, the acceptor material is a material from the group of the fullerenes or fullerene derivatives (preferably $C_{60}$ or $C_{70}$) or a PTCDI derivative (perylene-3,4,9,10-bis(dicarboximide) derivative).

In a further embodiment, the donor material is an oligomer, in particular an oligomer according to WO 2006092134, a porphyrine derivative, a pentacene derivative, or a perylene derivative, such as DIP (di-indeno-perylene) or DBP (di-benzo-perylene).

In a further embodiment, the p-material system contains a TPD derivative (triphenylamine dimer), a spiro compound, such as spiropyrane, spiroxazine, MeO-TPD (N, N,N',N'-tetrakis(4-methoxyphenyl)-benzidine), di-NPB(N,N'-diphenyl-N,N'-bis(N,N'-di(1-naphthyl)-N,N'-diphenyl-(1,1'-biphenyl) 4,4'-diamine), MTDATA (4,4',4''-tris-(N-3-methylphenyl-N-phenyl-amino)-triphenylamine), TNATA (4,4',4''-tris[N-(1-naphthyl)-N-phenyl-amino]-triphenylamine), BPAPF (9,9-bis{4-[di-(p-biphenyl)aminophenyl]}fluorene), NPAPF (9,9-bis[4-(N,N'-bis-naphthalene-2-yl-amino) phenyl]-9H-fluorene), spiro-TAD (2,2',7,7'-tetrakis-(diphenylamino)-9,9'-spirobifluorene), PV-TPD (N,N-di 4-2,2-diphenyl-ethene-1-yl-phenyl-N,N-di 4-methylphenylphenylbenzidine), 4P-TPD (4,4'-bis-(N,N-diphenylamino)-tetraphenyl), or a p-material described in DE102004014046.

In a further embodiment, the n-material system contains fullerenes, for example, $C_{60}$, $C_{70}$; NTCDA (1,4,5,8-naphthalene-tetracarboxylic-dianhydride), NTCDI (naphthalene tetracarboxylic diimide), or PTCDI (perylene-3,4,9,10-bis (dicarboximide).

In a further embodiment, the p-material system contains a p-dopant, wherein this p-dopant is F4-TCNQ, a p-dopant as described in DE10338406, DE10347856, DE10357044, DE102004010954, DE102006053320, DE102006054524, and DE102008051737, or a transition metal oxide (VO, WO, MoO, etc.).

In a further embodiment, the n-material system contains an n-dopant, wherein this n-dopant is a TTF derivative (tetrathiafulvalene derivative) or DTT derivative (dithienothiophene), an n-dopant as described in DE10338406, DE10347856, DE10357044, DE102004010954, DE102006053320, DE102006054524, and DE102008051737, or Cs, Li, or Mg.

In a further embodiment, one electrode is embodied as transparent having a transmission>80% and the other electrode is embodied as reflective having a reflection>50%.

In a further embodiment, the component is embodied as semitransparent having a transmission of 10-80%.

In a further embodiment, the organic materials used have a low melting point, preferably <100° C.

In a further embodiment, the organic materials used have a low glass transition temperature, preferably <150° C.

In a further embodiment, the optoelectronic components according to the invention are used in conjunction with energy buffers or energy storage media, for example, batteries, capacitors, etc. for connection to consumers or devices.

In a further embodiment, the optoelectronic components according to the invention are used in combination with thin-film batteries.

In a further embodiment, the optoelectronic components according to the invention are used on curved surfaces, for example, glass, concrete, roof tiles, clay, automobile glass, etc. It is advantageous in this case that the organic solar cells according to the invention, in relation to conventional inorganic solar cells, can be applied to flexible carriers such as foils, textiles, etc.

The above-described embodiments can also be combined with one another to implement the invention.

BRIEF DESCRIPTION OF THE DRAWING FIGURES

The invention is to be described in greater detail hereafter on the basis of several exemplary embodiments and figures. The exemplary embodiments are to describe the invention in this case without restricting it. In the figures.

DETAILED DESCRIPTION

Figure 1:
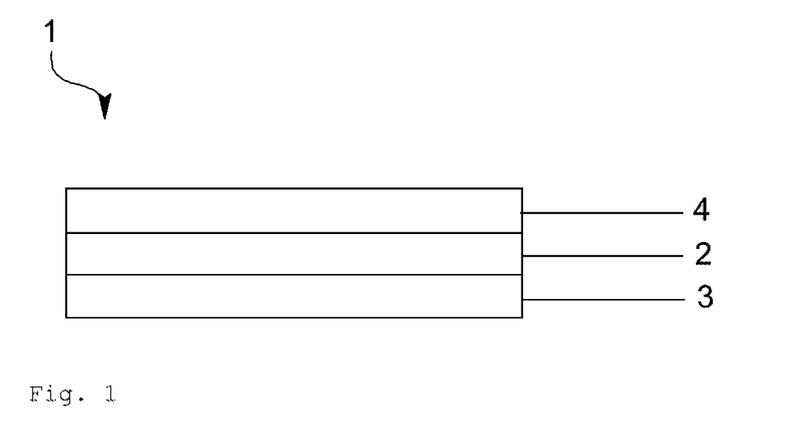
FIG. 1 shows a schematic illustration of a first embodiment according to the invention of an electrode arrangement.

In one exemplary embodiment of the invention, an electrode arrangement 1 according to the invention is shown in FIG. 1, which comprises a first intermediate layer 3 made of a metal or metal oxide, for example, made of $MoO_3$. The first intermediate layer 3 is deposited in this case by thermal vapor deposition on an organic layer of the component. A first layer 2 comprising a metal, for example, Ag, is deposited thereon. The deposition is performed in this case by means of sputtering. A second layer 4 is arranged as an antireflection layer, which comprises, for example, N,N'-bis (naphthalene-1-yl)-N,N'-bis(phenyl)-benzidine, on this first layer 2.

In a further exemplary embodiment of the invention (not shown in greater detail), the electrode arrangement 1 according to the invention comprises a first intermediate layer 3 made of a metal or metal oxide, for example, made of $MoO_3$. The first intermediate layer 3 is deposited in this case by thermal vapor deposition on an organic layer of the component. A first layer 2 comprising a metal alloy, for example, Ag:Ca, is deposited thereon. The deposition is performed in this case by means of sputtering. A second layer 4 is arranged as an antireflection layer, which comprises, for example, N,N'-bis(naphthalene-1-yl)-N,N'-bis(phenyl)-benzidine, on this first layer 2.

In a further exemplary embodiment of the invention (not shown in greater detail), the electrode arrangement 1 according to the invention comprises a first intermediate layer 3 made of an alkali or alkaline earth metal, for example, made of Ca. The first intermediate layer 3 is deposited in this case by thermal vapor deposition on an organic layer of the component. A first layer 2 comprising a metal alloy, for example, Ag:Ca, is deposited thereon. The deposition is performed in this case by means of sputtering. A second layer 4 is arranged as an antireflection layer, which comprises, for example, ZnS, ZnSe, or ZnTe, on this first layer 2.

In a further exemplary embodiment of the invention (not shown in greater detail), the electrode arrangement 1 according to the invention comprises a first intermediate layer 3 made of an alkali or alkaline earth metal, for example, made of Mg. The first intermediate layer 3 is deposited in this case by thermal vapor deposition on an organic layer of the component. A first layer 2 comprising a metal alloy, for example, Ag:Mg, is deposited thereon. The deposition is performed in this case by means of sputtering. A second layer 4 is arranged as an antireflection layer, which comprises, for example, ZnS, ZnSe, or ZnTe, on this first layer 2.

Figure 2:
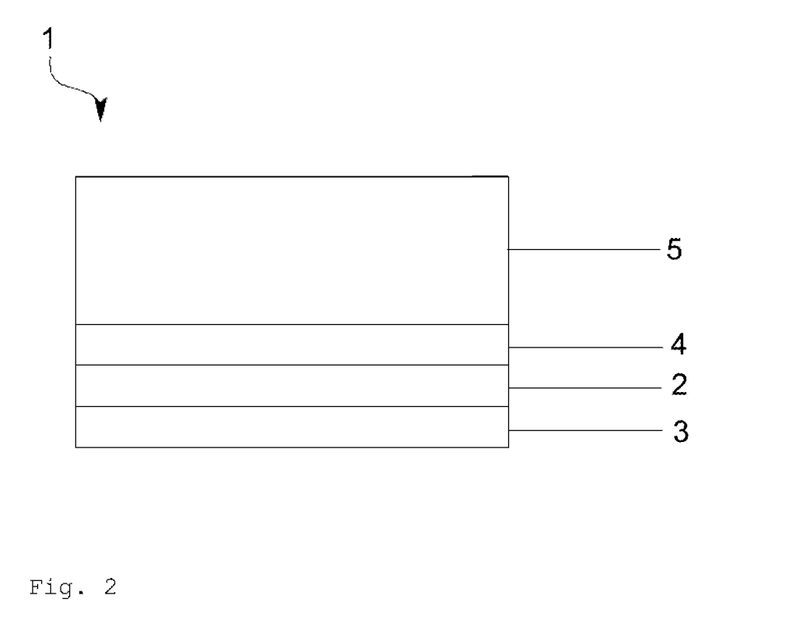
FIG. 2 shows a schematic illustration of a second embodiment according to the invention of an electrode arrangement.

In a further exemplary embodiment, a further design of an electrode arrangement 1 is shown in FIG. 2, which comprises the same structure as the preceding exemplary embodiment, wherein a scratch protection layer 5 is arranged on the second layer 4. This scratch protection layer 5 can be embodied from $TiO_2$, for example, and can have a layer thickness of 150 nm.

Figure 3:
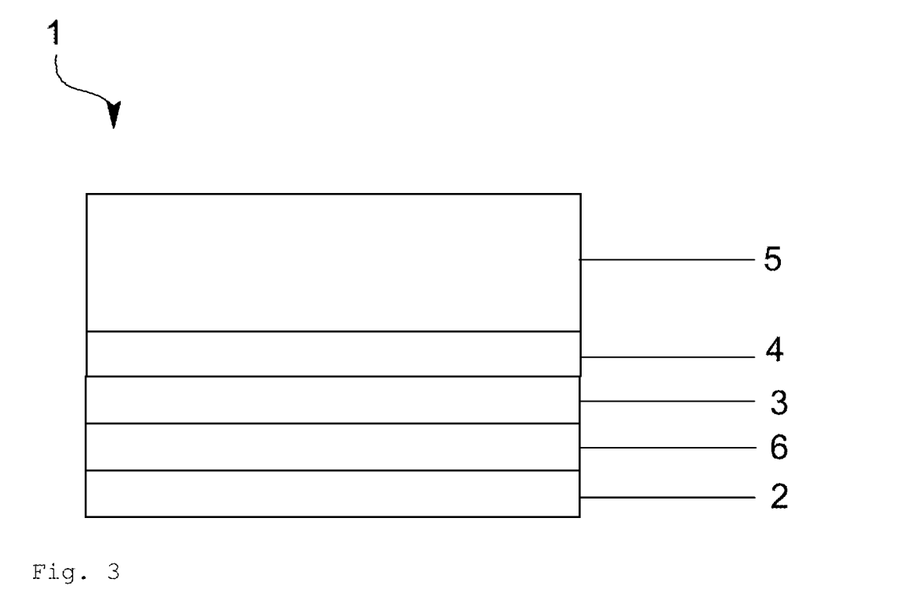
FIG. 3 shows a schematic illustration of a third embodiment according to the invention of an electrode arrangement.

In a further exemplary embodiment, a schematic illustration of an electrode arrangement 1 is shown in FIG. 3, which comprises a first intermediate layer 3 made of a metal or metal oxide, for example, made of $MoO_3$. A second intermediate layer 6 made of $Nb_2O_5$ is arranged thereon, which has a layer thickness between 5 and 40 nm. The first layer 2 made of metal, for example, Ag, is deposited on this second intermediate layer 6, wherein the deposition is performed by sputtering. A second layer 4 is arranged as an antireflection layer, which comprises, for example, N, N'-bis (naphthalene-1-yl)-N, N'-bis(phenyl)-benzidine on this first layer 3. A scratch protection layer 5 is arranged on this second layer 4. This scratch protection layer 5 can be embodied from $TiO_2$, for example, and can have a layer thickness of 150 nm.

In a further exemplary embodiment (not shown in greater detail), an electrode arrangement 1 comprises a first intermediate layer 3 made of a metal or metal oxide, for example, made of MoO$_3$. A second intermediate layer 6 made of Mg is arranged thereon, which has a layer thickness between 5 and 40 nm. The first layer 3 made of a metal alloy, for example, Ag:Mg, is deposited on this second intermediate layer 6, wherein the deposition is performed by sputtering. A second layer 4 is arranged as an antireflection layer, which comprises, for example, ZnS, on this first layer 3. A scratch protection layer 5 is arranged on this second layer 4. This scratch protection layer 5 can be embodied from TiO$_2$, for example, and can have a layer thickness of 150 nm.

In a further exemplary embodiment (not shown in greater detail), an electrode arrangement 1 comprises a first intermediate layer 3 made of a metal or metal oxide, for example, made of MoO$_3$. A second intermediate layer 6 made of Ca is arranged thereon, which has a layer thickness between 5 and 40 nm. The first layer 3 made of a metal alloy, for example, Ag:Ca, is deposited on this second intermediate layer 6, wherein the deposition is performed by sputtering. A second layer 4 is arranged as an antireflection layer, which comprises, for example, ZnSe, on this first layer 3. A scratch protection layer 5 is arranged on this second layer 4. This scratch protection layer 5 can be embodied from TiO$_2$, for example, and can have a layer thickness of 150 nm.

In one design of the above-described exemplary embodiment (not shown in greater detail), the second intermediate layer 6 is embodied from aluminum-doped zinc oxide (AZO). The layer thickness can be between 5 and 40 nm in this case.

In one design of the above-described exemplary embodiment (not shown in greater detail), the second intermediate layer 6 is embodied from Al. The layer thickness can be between 0.2 and 3 nm in this case.

In one design of the above-described exemplary embodiment (not shown in greater detail), the electrode arrangement 1 has a first intermediate layer 3, which comprises a metal or metal oxide, for example, made of MoO$_3$. A second intermediate layer 6 made of Nb$_2$O$_5$ is arranged thereon, which has a layer thickness between 5 and 40 nm. The first layer 3 made of a metal, for example, Ag, is deposited on this second intermediate layer 6, wherein the deposition is performed by sputtering. A scratch protection layer 5 is arranged on this first layer 3. This scratch protection layer 5 can be embodied from TiO$_2$, for example, and can have a layer thickness of 150 nm.

Figure 4:
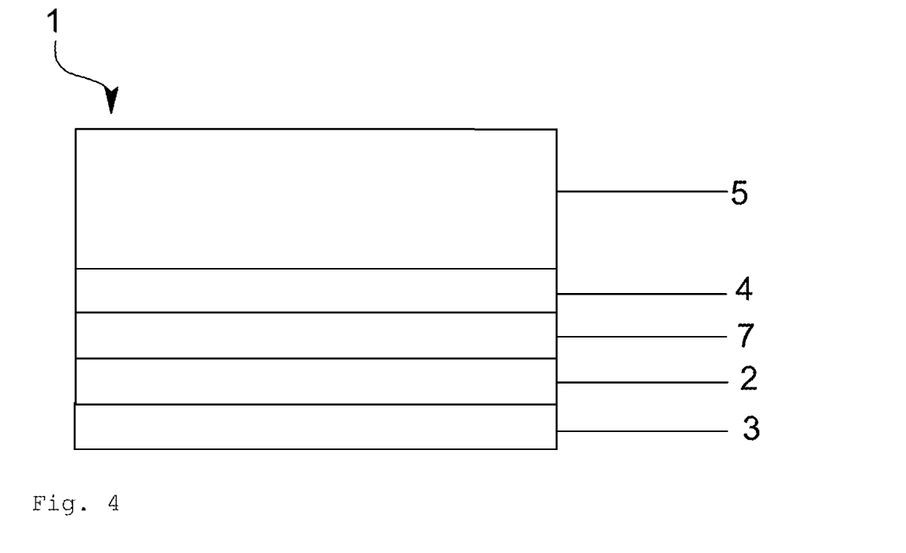
FIG. 4 shows a schematic illustration of a fourth embodiment according to the invention of an electrode arrangement.

In a further exemplary embodiment, a schematic illustration of an electrode arrangement 1 is shown in FIG. 4, which comprises a first intermediate layer 3 made of a metal or metal oxide, for example, made of MoO$_3$. A second intermediate layer 6 made of Nb$_2$O$_5$ is arranged on this first intermediate layer 3, which has a layer thickness between 5 and 40 nm. A first layer 2 made of a metal, for example, Ag, is arranged thereon, wherein the deposition of the first layer 2 is performed by means of sputtering. A third intermediate layer 7, for example, made of ITO, is arranged on this first layer 2. The layer thickness of this third intermediate layer 7 made of ITO is between 5 and 40 nm. A second layer 4 is arranged as an antireflection layer, which comprises, for example, N,N'-bis(naphthalene-1-yl)-N,N'-bis(phenyl)-benzidine, on this third intermediate layer 7. A scratch protection layer 5 is arranged on this second layer 4. This scratch protection layer 5 can be embodied from TiO$_2$, for example, and can have a layer thickness of 150 nm.

In one design of the above-described exemplary embodiment, the third intermediate layer 7 is embodied from aluminum-doped zinc oxide AZO, wherein this intermediate layer has a layer thickness between 5 and 40 nm.

In a further design of the above-described exemplary embodiment (not shown in greater detail), the electrode arrangement 1 has a first intermediate layer 3, which comprises a metal or metal oxide, for example, made of MoO$_3$. A second intermediate layer 6 made of Nb$_2$O$_5$ is arranged on this first intermediate layer 3, which has a layer thickness between 5 and 40 nm. A first layer 3 made of a metal, for example, Ag, is arranged thereon, wherein the deposition of the first layer 2 is performed by means of sputtering. A third intermediate layer 7, for example, made of ITO, is arranged on this first layer 2. The layer thickness of this third intermediate layer 7 made of ITO is between 5 and 40 nm. A scratch protection layer 5 is arranged on this third intermediate layer 7. This scratch protection layer 5 can be embodied from TiO$_2$, for example, and can have a layer thickness of 150 nm.

In a further design of the above-described exemplary embodiment (not shown in greater detail), the electrode arrangement 1 has a first intermediate layer 3, which comprises a metal or metal oxide, for example, made of MoO$_3$. A second intermediate layer 6 made of Nb$_2$O$_5$ is arranged on this first intermediate layer 3, which has a layer thickness between 5 and 40 nm. A first layer 2 made of a metal, for example, Ag, is arranged on this second intermediate layer 6, wherein the deposition of the first layer 2 is performed by means of sputtering. A third intermediate layer 7, for example, made of ITO, is arranged on this first layer 2. The layer thickness of this third intermediate layer 7 made of ITO is between 5 and 40 nm. A second layer 4 is arranged as an antireflection layer, which comprises, for example, N,N'-bis(naphthalene-1-yl)-N,N'-bis(phenyl)-benzidine, on this third intermediate layer 7. A scratch protection layer 5 is arranged on this second layer 4. This scratch protection layer 5 can be embodied from TiO$_2$, for example, and can have a layer thickness of 150 nm.

In a further exemplary embodiment (not shown in greater detail), the electrode arrangement 1 comprises a first intermediate layer 3 made of a metal or metal oxide, for example, made of MoO$_3$. A second intermediate layer 6 made of Mg is arranged on this first intermediate layer 3, which has a layer thickness between 5 and 40 nm. A first layer 2 made of a metal alloy, for example, Ag:Mg, is deposited on this second intermediate layer 6, wherein the deposition of the first layer 2 is performed by sputtering. A third intermediate layer 7, for example, made of Mg, is arranged on this first layer 2. The layer thickness of this third intermediate layer 7 made of Mg is between 5 and 40 nm. A second layer 4 is arranged as an antireflection layer, which comprises, for example, ZnS, ZnSe, or ZnTe, on this third intermediate layer 7. A scratch protection layer 5 is arranged on this second layer 4. This scratch protection layer 5 can be embodied from TiO$_2$, for example, and can have a layer thickness of 150 nm.

In a further exemplary embodiment (not shown in greater detail), the electrode arrangement 1 comprises a first intermediate layer 3 made of a metal or metal oxide, for example, made of MoO$_3$. A second intermediate layer 6 made of Nb$_2$O$_5$ is arranged on this first intermediate layer 3, which has a layer thickness between 5 and 40 nm. A first layer 2 made of a metal, for example, Ag, is deposited on this second intermediate layer 6, wherein the deposition of the first layer 2 is performed by sputtering. A third intermediate layer 7, for example, made of ITO, is arranged on this first layer 2. The layer thickness of this third intermediate layer 7 made of ITO is between 5 and 40 nm. A scratch protection layer 5 is arranged on this third intermediate layer 7. This scratch protection layer 5 can be embodied from $TiO_2$, for example, and can have a layer thickness of 150 nm.

The invention claimed is:

1. An organic solar cell on a substrate comprising a first electrode and a second electrode, wherein the first electrode is arranged on the substrate and the second electrode forms a counter electrode, wherein at least one photoactive layer system is arranged between the first electrode and the second electrode, and the at least one photoactive layer system comprises at least one donor-acceptor system having organic materials, wherein the counter electrode includes a first layer comprising Ag or a metal alloy comprising Ag, a second layer being arranged on the first layer and having a layer thickness between 10 and 100 nm and an index of refraction of more than 2, wherein the second layer comprises an alkali or alkaline earth metal or a nitride, selenide, sulfide, oxide, or telluride, a first intermediate layer made of Ca, Mg, or $MoO_x$, wherein the first intermediate layer is arranged between the first layer and the second layer, and a second intermediate layer made of $Nb_2O_5$, wherein the second intermediate layer has a layer thickness between 5 and 40 nm and is incorporated between the first intermediate layer and the first layer.

2. The organic solar cell according to claim 1, wherein the metal alloy comprises an alloy of Ag and Ca or an alloy of Ag and Mg.

3. The organic solar cell according to claim 2, wherein a proportion of the Ag or Ca or Mg is at least 30%.

4. The organic solar cell according to claim 1, wherein the first intermediate layer of the counter electrode has a layer thickness between 0.1 and 100 nm and is deposited by thermal vapor deposition.

5. The organic solar cell according to claim 1, wherein the first layer of the counter electrode has a layer thickness between 3 and 20 nm.

6. The organic solar cell according to claim 1, wherein a protective layer comprising a metal oxide and having a layer thickness greater than 100 nm is arranged on the second layer.

7. The organic solar cell according to claim 1, wherein a further intermediate layer made of a metal or metal oxide is incorporated between the first layer and the second layer of the counter electrode.

8. The organic solar cell according to claim 1, wherein the substrate is opaque or transparent.

9. The organic solar cell according to claim 1, wherein the substrate is flexible.

10. The organic solar cell according to claim 1, wherein the cell comprises a pin single cell, pin tandem cell, pin multiple cell, nip single cell, nip tandem cell, or nip multiple cell.

11. The organic solar cell according to claim 5, wherein the first layer of the counter electrode has a layer thickness between 5 to 10 nm.

12. The organic solar cell according to claim 1, wherein the second layer has an index of refraction of 2.2.

* * * * *